United States Patent [19]

Carlsson

[11] Patent Number: 4,475,620

[45] Date of Patent: Oct. 9, 1984

[54] LOUDSPEAKER WITH WALL REFLEX ABSORBER

[76] Inventor: Stig Carlsson, Torkel Knutssonsgatan 15, S-117 25 Stockholm, Sweden

[21] Appl. No.: 443,942

[22] Filed: Nov. 23, 1982

[30] Foreign Application Priority Data

Nov. 26, 1981 [SE] Sweden ................................ 8107050

[51] Int. Cl.3 ................................................ H05K 5/00

[52] U.S. Cl. .................................... 181/146; 181/151; 181/154; 181/155; 181/199; 381/90

[58] Field of Search ................................ 181/144–147, 181/150–156, 199, 175, 159; 381/87–90

[56] References Cited

U.S. PATENT DOCUMENTS

| | | | |
|---|---|---|---|
| 4,006,311 | 2/1977 | Carlsson | 181/154 X |
| 4,167,985 | 9/1979 | Dunlavy | 181/146 X |
| 4,179,585 | 12/1979 | Herrenschmidt | 181/154 X |
| 4,227,050 | 10/1980 | Wilson | 181/144 X |
| 4,433,749 | 2/1984 | Watkins et al. | 181/151 |

FOREIGN PATENT DOCUMENTS 2059221 4/1981 United Kingdom .

*Primary Examiner*—Benjamin R. Fuller

*Attorney, Agent, or Firm*—Burmeister, York, Palmatier, Hamby & Jones

[57] ABSTRACT

A loudspeaker is provided for high-quality and particularly stereophonic sound reproducing systems positioned close to a wall of a room. To reduce distortion due to that part of the reflected sound which arrives from substantially the same direction as the direct sound, the positioning of the sound radiating surfaces is such as to make the reflected sound from the wall arrive substantially in phase with the direct sound throughout a large frequency range, while at higher frequencies the reflected sound is attenuated by a sound absorber.

The loudspeaker has a casing with a rear wall (5*a*). Loudspeaker units arranged to be the sound source for mid-range (12*b*) and/or high (14*a*) frequencies has the sound radiating surfaces (12*b*, 15*a*) at short distance (D2, D1) from the plane of the rear wall (5*a*) and facing slantwise forwards. A sound absorber (28*a*) at the side of the casing, in front of and near the plane of the rear wall (5*a*) and near the sound radiating surfaces (12*b*, 15*a*), serves to attenuate that part of the sound reflected by the room-wall which has wave-lengths shorter than eight times the shortest distance (D1, D2) of the sound radiating surfaces from the plane of the rear wall (5*a*).

In stereophonic systems the left-hand and the right-hand loudspeakers form a mirror-image pair.

11 Claims, 5 Drawing Figures

LOUDSPEAKER WITH WALL REFLEX ABSORBER

This invention relates to loudspeakers for high-quality and particulary stereophonic sound reproducing systems intended to be positioned near a wall of a room, and especially to loudspeakers of this type which include means for radiating the mid and/or high frequency ranges.

The quality of reproduction which a loudspeaker can provide in a room is known to be influenced by the loudspeaker's interaction with adjacent reflecting boundary surfaces in the room, and especially by the reflected sound from the wall behind the loudspeaker. Reflected sound from this wall arrives substantially in phase with the direct sound at very low frequencies which increases the efficiency of the loudspeaker in this frequency range. The phase angle between the direct sound and the reflected sound is proportional to the frequency, and the resulting sound at higher frequencies will alternate between minima when the phase angle amounts to 180, 540, 900 etc. degrees and maxima when the phase angle amounts to 360, 720, 1080 etc. degrees. The first minimum usually occurs between 100 and 300 Hz, depending on the distance of the sound radiating surfaces from the wall. The reflected sound distorts not only the loudspeaker's amplitude response in the frequency domain but also its amplitude response in the time domain.

I have found that disturbances due to the reflected sound from the wall behind the loudspeaker can occur even at relatively high frequencies, especially when the front of the loudspeaker with its sound radiating surfaces is oriented in a direction which makes an acute angle with the room wall. In stereophonic sound reproduction it is often recommended that the two loudspeakers and the listener are positioned in the corners of an imaginary equilateral triangle and that the loudspeakers are oriented so as to face the listener or a point in front of the listener. The reflected sound which the listener receives from the wall behind the loudspeakers is in this case originating from directions forming an angle of only 120 degrees with the frontal direction of each loudspeaker. The fact that the radiation in these directions can be considerable, even at a frequency as high as 4 kHz, is verified by FIG. 3 of GB-A No. 2 059 221 which shows the radiation pattern of a loudspeaker with and without an acoustically absorbent bonnet which primarily attenuates the rearward radiation of the loudspeaker.

It is an object of the present invention to provide a loudspeaker for the mid and/or high frequency ranges intended to be placed close to a wall, which loudspeaker has its axis or axes of radiation directed to make an angle or angles of substantially from 30 to 60 degrees with the wall, and in which means are provided for substantially reducing the amount of reflected sound received from the wall. (The reflected sound is then originating from directions making angles of substantially from 90 to 120 degrees with the axis or axes of radiation of the loudspeaker.)

It is another object of the present invention to provide a loudspeaker of the above type which also radiates lower frequencies, and in which means are provided for substantially reducing the distortion due to reflected sound from the wall throughout the frequency range reproduced.

The above-mentioned objects are achieved with a loudspeaker comprising a casing having a rear wall which wall defines a rear plane, and a number of loudspeaker units arranged to be the sound source for the mid and/or high frequency ranges, the sound radiating surface or surfaces of which being located at short distance from said rear plane and facing slantwise forwards, said loudspeaker being characterized by sound absorbing means arranged in front of the said rear plane so as to form a sound absorber placed at the side of the said casing and located near said sound radiating surface or surfaces and near said rear plane, said sound absorber being intended to attenuate that part of the sound radiated towards the said rear plane which has wavelengths shorter than eight times the shortest distance of the said sound radiating surface or surfaces from the said rear plane.

I have found that a wall reflux absorber arranged at the side of a wall mounted loudspeaker will effectively attenuate the reflected sound from the wall at the rear of the loudspeaker, if the loudspeaker has its sound radiating surface or surfaces arranged at a very short distance from its rear plane. The reasons appear to be at least twofold. Firstly, the nearer the sound radiating surface is to the wall, the higher is the frequency above which the reflected sound arrives out of phase with the direct sound and needs to be attenuated; and the higher the lowest frequency is which needs to be attenuated, the smaller quantity of sound absorbing material is required. Secondly, the nearer the sound radiating surface is to the wall, the smaller part of the wall area needs to be covered by sound absorbing material. Additionally, the nearer the sound radiating surface is to the wall, the more is the frequency range extended in which the reflected sound arrives virtually in phase with the direct sound, increasing the efficiency of the loudspeaker. The invention appears to provide the only practical means to effectively reduce the distortion due to that part of the reflected sound which arrives from substantially the same direction as the direct sound.

In the loudspeaker according to the invention, reflected sound having wave-lengths longer than eight times the shortest distance of the sound radiating surface or surfaces from the wall would not be attenuated. It arrives closely enough in phase with the direct sound to avoid any disturbances, but its effect on the efficiency of the loudspeaker shall be included in the design of the frequency response curves of the loudspeaker.

With an aim to clarify, but not to limit, the invention, a number of embodiments will be described with reference to the accompanying drawings.

The loudspeakers shown in FIGS. 1, 3, 4 and 5 are the left-hand loudspeakers of a mirror-image pair of stereophonic loudspeakers.

Figure 1:
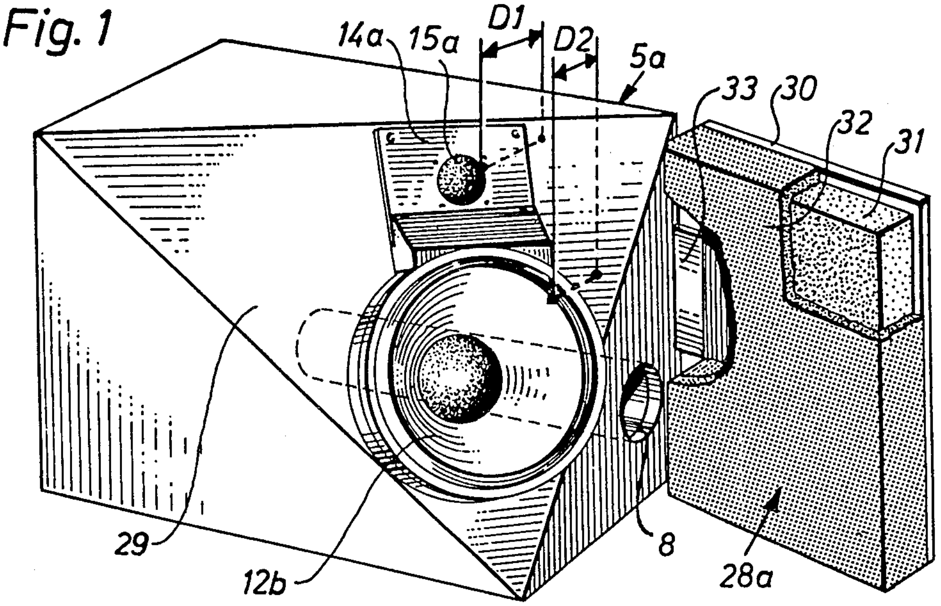
FIG. 1 is a partly sectioned perspective view of a loudspeaker according to the invention, intended for the frequency range 35–20,000 Hz.
Figure 3:
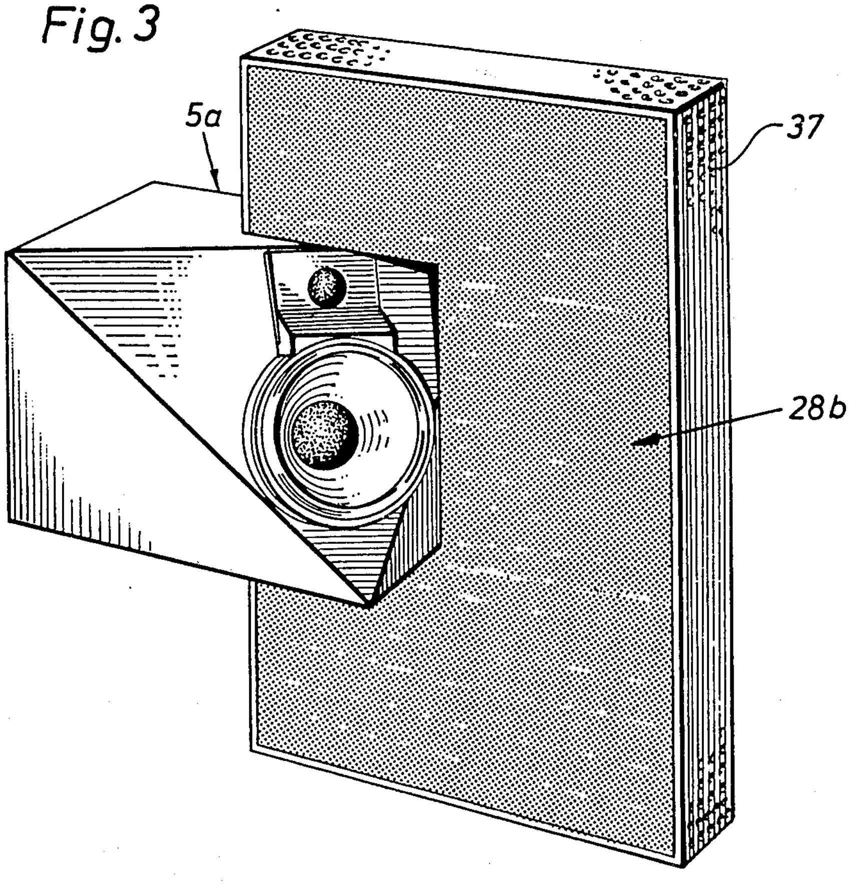
FIG. 3 is a perspective view of a modified embodiment of the loudspeaker shown in FIG. 1 having a larger wall reflex absorber.

The loudspeakers shown in FIGS. 1 and 3 have a casing in the shape of a truncated right-angled parallelepiped with three rectangular and four triangular walls. In a sloping frontal wall 29 a loudspeaker unit **12*b* is arranged so as to co-operate with the internal volume of the casing and with a ducted port 8 and so as to be the sound source for the low and mid-range frequencies up to between 2 and 3 kHz. A loudspeaker unit 14*a* with a dome-shaped diaphragm 15*a*** is arranged to be the sound source for the higher frequencies.

The loudspeaker units **12*b* and 14*a* are mounted so as to have a common plane of symmetry which is, in this case, inclined at an angle of 60 degrees with respect to the rear wall 5*a* of the casing. The slope of the frontal wall 29 will provide the axes of radiation of the loudspeaker units 12*b* and 14*a* with an upward inclination of 36 degrees with respect to the bottom wall of the casing, thereby forming an angle of 44.5 degrees between said axes and the rear wall 5*a***.

A loudspeaker unit **12*b* with, for instance, an outside diameter of 0.18 m in a casing 0.43 m wide, 0.30 m high and 0.25 m deep will have its sound radiating surface at a shortest distance D2 of 0.15 m from the plane of the rear wall 5*a*. The loudspeaker unit 14*a* will have its diaphragm 15*a*** at a shortest distance D1 of 0.1 m from the same rear plane.

Figure 2:
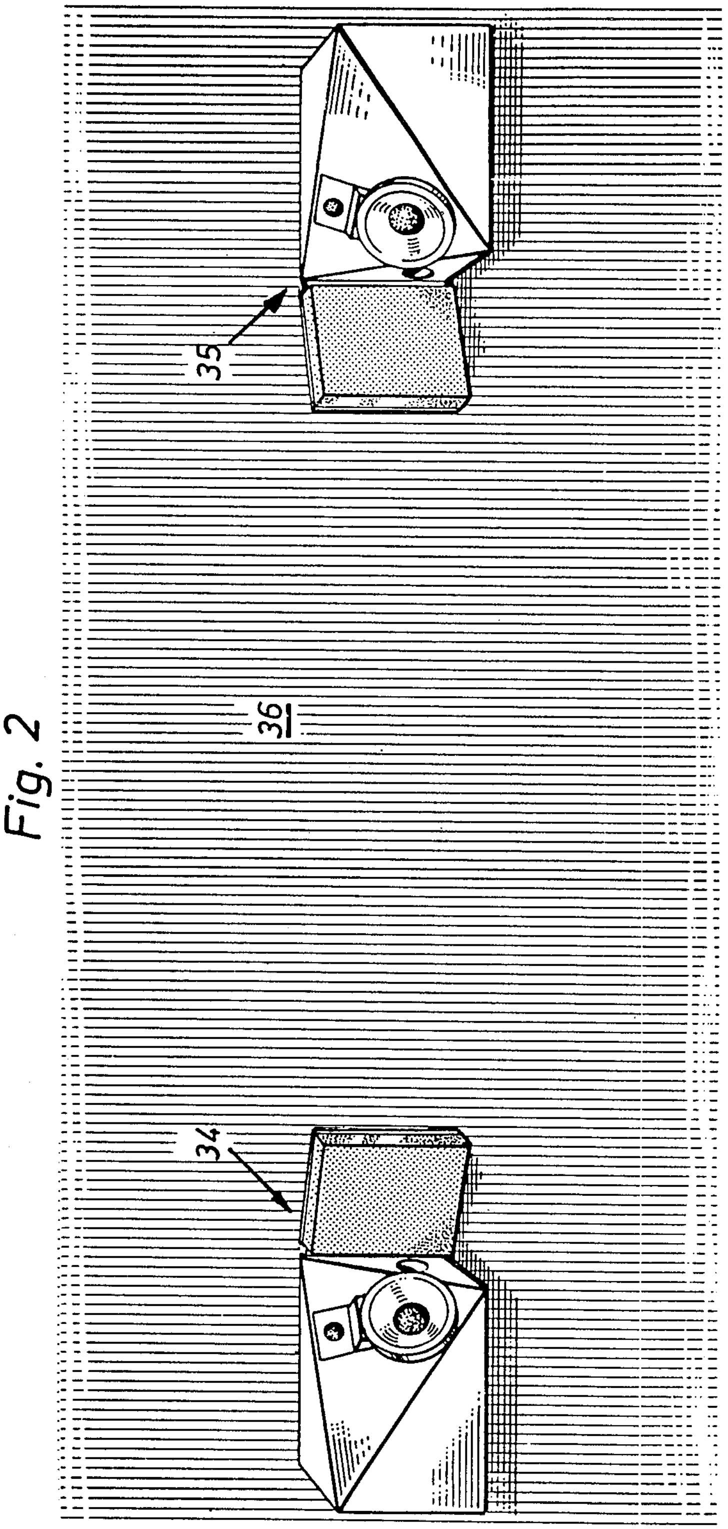
FIG. 2 is a perspective view of a stereophonic loudspeaker system consisting of two loudspeakers according to FIG. 1, positioned on a vertical wall in a room.

The stereophonic loudspeaker system shown in FIG. 2 comprising a left-hand loudspeaker 34 and a right-hand loudspeaker 35, is placed with each rear wall **5*a* close to a vertical wall 36** of a room.

The wall reflex absorber **28*a* (FIG. 1) has a structural wall 30, a thick layer of sound absorbing material 31 and a thin outer layer of acoustically transparent foamed plastics 32. By means of a mounting device the wall reflex absorber is placed directly in front of the plane of the rear wall 5*a* of the casing and is inclined at an angle of between 10 and 20 degrees with respect to the rear wall 5*a* in such a manner that the angle which a common plane of symmetry of the loudspeaker units 12*b* and 14*a* makes with a room wall behind the loudspeaker can be reduced from 60 to between 50 and 40 degrees without substantially increasing the distance of the sound radiating surface of the loudspeaker unit 12*b* from the room wall. The axes of radiation of the sound radiating surfaces then make an acute angle of between 38.3 and 31.3 degrees with a plane that is flush with the frontal surface of the wall reflex absorber 28*a***.

In a loudspeaker as shown in FIG. 1 and having a casing of the size stated above, the wall reflex absorber **28*a* is 0.30 m high and 0.22 m wide and comprises a 0.05 m thick mineral-wool slab with a density of 150 kg/m$^3$. In a loudspeaker as shown in FIG. 3 the wall reflex absorber 28*b* is about 0.8 m high and 0.5 m wide, comprises a 0.10 m thick mineral-wool slab of the same density, and has a perforated frame 37. The wall reflex absorber 28*b* is mounted with its back flush with the plane of the rear wall 5*a*** and has a cutout 0.3 m high and 0.2 m wide so as to make the wall reflex absorber surround the loudspeaker units from three sides.

A loudspeaker as shown in any of FIGS. 1 and 3, having a casing of the size stated above and positioned with its rear wall **5*a* close to a room wall, will have its first response minimum at about 500 Hz. The smoothest response will be obtained if the wall reflex absorber attenuates the sound above a frequency in the order of 270 to 300 Hz, at which the wave-length of sound amounts to about eight times the shortest distance D2 of the sound radiating surface of the loudspeaker unit 12*b* from the plane of the rear wall 5*a*, and if the attenuation is virtually perfect from about 400 Hz and up. The wall reflex absorber 28*b* comes close to this, but even the smaller wall reflex absorber 28*a*** provides meaningful improvement in measuring as well as listening. The bigger absorber should be preferred for professional applications, and the smaller one for domestic applications.

In modified embodiments of the loudspeakers shown in FIGS. 1 and 3 the sloping frontal wall 29 can form an angle of 30 to 60 degrees with the rear wall **5*a*** of the loudspeaker.

Figure 4:
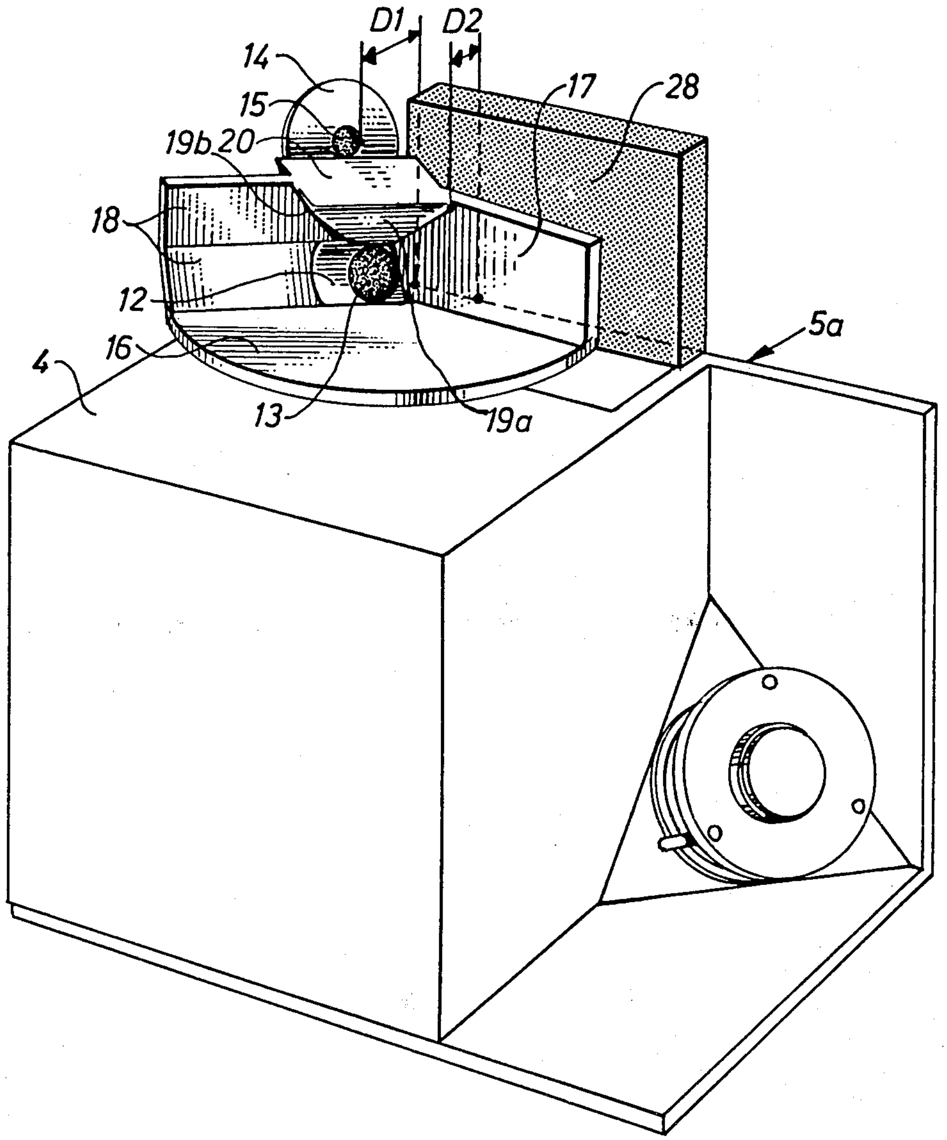
FIG. 4 is a perspective view of another embodiment of a loudspeaker according to the invention, intended for the frequency range 20–20,000 Hz, in which only the sound radiating means for frequencies above 800 Hz have a wall reflex absorber.

The loudspeaker shown in FIG. 4 has sound radiating means 12–20 arranged on the top wall 4 of a casing, near the rear wall **5*a*, for radiating the frequency range above 800 or 1000 Hz. They comprise a mid-range unit 12, the diaphragm 13 of which co-operates with a horn-type structure having the reflecting surfaces 16, 17, 18, 19*a*, 19*b*, and furthermore a treble unit 14, the diaphragm 15 of which co-operates with a substantially horizontal reflecting surface 20. The sound radiated in directions to be reflected by a room wall flush with the rear wall 5*a* has the open end of the horn-type structure as its radiating surface in the mid-range, and the diaphragm 15 is the sound radiating surface in the treble range. The shortest distances D2 and D1, respectively, of these sound radiating surfaces from the plane of the rear wall 5*a* are less than 0.1 m. In this case, however, the wall reflex absorber only needs to attenuate reflected sound above 600 or 800 Hz, and especially the reflected sound above 3 kHz originating from the diaphragm 15. The wall reflex absorber 28 is about 0.2 m high and 0.35 m wide, and its internal construction is similar to that of the wall reflex absorber 28*a* shown in FIG. 1 and comprises a 0.05 m thick mineral-wool slab with a density of 70 kg/m$^3$. It is placed on the top wall 4*a* close to and directly in front of the rear wall 5*a*** and near the said sound radiating surfaces.

Figure 5:
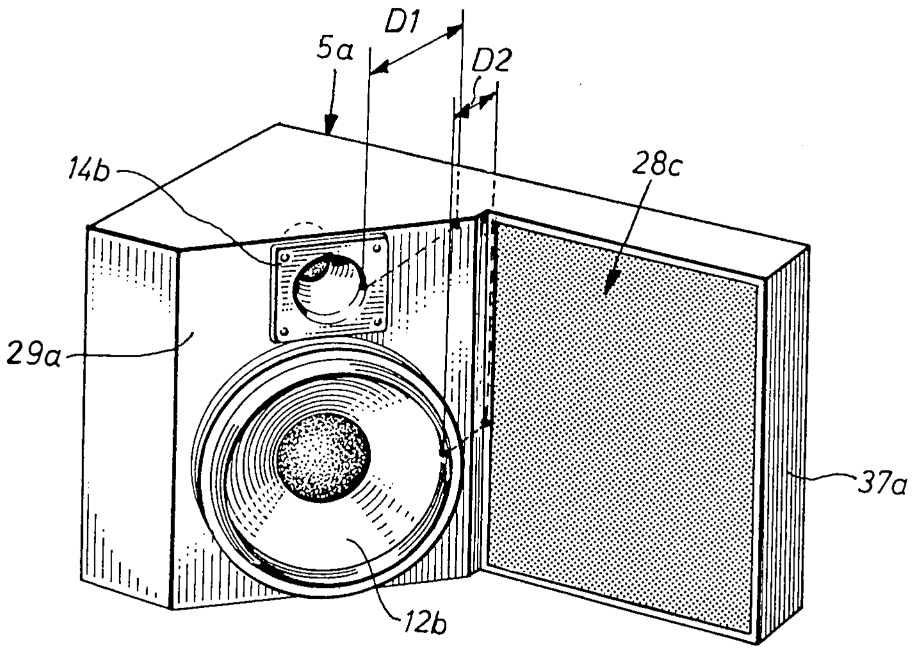
FIG. 5 is a perspective view of still another embodiment of a loudspeaker according to the invention, intended for the frequency range 100–20,000 Hz, and in which the wall reflex absorber forms an integrated part of a loudspeaker casing.

The loudspeaker shown in FIG. 5 is a small loudspeaker which can be used in combination with a separate loudspeaker for the low frequency range and as an alternative to the sound radiating means 12–20 and the wall reflex absorber 28 of the loudspeaker shown in FIG. 4. A frame **37*a* of a wall reflex absorber 28*c* is an integrated part of the casing. A loudspeaker unit 12*b* arranged to radiate frequencies lower than 2 or 3 kHz and a horn-type treble unit 14*b* arranged to radiate higher frequencies are mounted in the frontal wall 29 of the casing and have their axes of radiation inclined at an angle of between 45 and 60 degrees with respect to the rear wall 5*a* of the casing as well as with respect to a plane flush with the frontal surface of the wall reflex absorber 28*c***.

In the various embodiments of the invention which are described with reference to FIGS. 1, 3 and 5 the axes of radiation of the loudspeaker units **12*b*, 14*a* and 14*b* are inclined at acute angles with respect to a plane flush with the frontal surface of the wall reflex absorbers 28*a*, 28*b* and 28*c*, respectively, which amount to between 31.3 and 60 degrees, and the shortest distances D1, D2 of the sound radiating surfaces from the plane of the rear wall 5*a*** is less than 0.25 m and usually about 0.1 to 0.15 m.

A wall reflex absorber in combination with mid frequency range loudspeaker units comprises a number of layers of for instance mineral wool and/or felt having a density of from 60 to 250 $kg/m^3$ and a thickness of from 0.2 to 0.7 times the said shortest distance D2 of the sound radiating surface or surfaces from the said rear plane and a frontal area of from 2 to 15 times the square of the same distance D2.

A wall reflex absorber in combination with high frequency range loudspeaker units comprises a number of layers of for instance mineral wool and/or felt having a density of from 40 to 200 $kg/m^3$ and a thickness of at least 0.01 m and a frontal surface of at least 0.01 $m^2$.

I claim:

1. A loudspeaker comprising a casing having a rear wall which wall defines a rear plane, and an electro acoustical loudspeaker unit adapted to be a sound source, said loudspeaker unit being mounted on the casing and having a sound radiating surface located at a short distance from said rear plane and facing forwards at an acute angle to the rear wall, said loudspeaker unit having an acoustical axis of radiation normal to the said radiating surface thereof, characterized by sound absorbing means disposed in front of and adjacent to the said rear plane at the side of the said casing, said absorber being disposed near said sound radiating surface and being adapted to attenuate that part of the sound radiated towards the said rear plane which has wavelengths shorter than eight times the shortest distance of the said sound radiating surface from the said rear plane.

2. A loudspeaker as claimed in claim 1, wherein the sound absorber has a flat frontal surface and said frontal surface is disposed at an acute angle of substantially from 30 to 60 degrees with the axis of radiation of the said loudspeaker unit.

3. A loudspeaker as claimed in claim 1 wherein the shortest distance of the said sound radiating surface from the said rear plane is less than 0.25 m.

4. A loudspeaker as claimed in claim 1, wherein the said casing has a sloping frontal wall in which the said loudspeaker unit is mounted, said sloping frontal wall making an angle of from 30 to 60 degrees with said rear plane.

5. A loudspeaker as claimed in claim 4, wherein the said casing has the shape of a truncated right-angled parallelepiped in which the said rear wall, the bottom wall and one side wall have rectangular outlines, and the said sloping frontal wall and the adjoining front, top and side walls have triangular outlines.

6. A loudspeaker as claimed in claim 1, wherein the said loudspeaker unit is adapted to radiate mid-range frequencies, said sound absorbing means comprising a number of layers of mineral wool having a density of from 60 to 250 $kg/m^3$ and a thickness of from 0.2 to 0.7 times the said shortest distance of the sound radiating surface from the said rear plane and a frontal area of from 2 to 15 times the square of the same distance.

7. A loudspeaker as claimed in claim 1, wherein the said loudspeaker unit is adapted to radiate high frequencies, and said sound absorbing means comprises a number of layers of mineral wool having a density of from 40 to 200 $kg/m^3$ and a thickness of at least 0.01 m and a frontal surface of at least 0.01 $m^2$.

8. A loudspeaker as claimed in claim 1 wherein the shortest distance of the said sound radiating surface from the rear plane is from 0.1 to 0.15 m.

9. A loudspeaker as claimed in claim 1 wherein the said loudspeaker unit is adapted to radiate mid-range frequencies, the sound absorbing means comprising a number of layers of felt having a density of from 60 to 250 $kg/m^3$ and a thickness of from 0.2 to 0.7 times the said shortest distance of the sound radiating surface from the said rear plane and a frontal area of from 2 to 15 times the square of the same distance.

10. A loudspeaker as claimed in claim 1 wherein the said loudspeaker unit is adapted to radiate the highest frequency range of the loudspeaker and said sound absorbing means comprises a number of layers of felt having a density of from 40 to 200 $kg/m^3$ and a thickness of at least 0.01 m and a frontal surface of at least 0.01 $m^2$.

11. A loudspeaker as claimed in claim 1 wherein a plurality of loudspeaker units are mounted on the casing, each of said units having a sound radiating surface located at a short distance from said rear plane and facing forwards at an acute angle to the rear wall, each of said louspeaker units having an acoustical axis of radiation normal to the said radiating surface thereof, one of said loudspeaker units being adapted to radiate sounds throughout a frequency range at the upper limit of said loudspeaker and another of said loudspeaker units being adapted to radiate sounds throughout a second frequency range immediately below the first frequency range.

* * * * *